United States Patent
Hatano et al.

(10) Patent No.: US 9,449,861 B2
(45) Date of Patent: Sep. 20, 2016

(54) SUBSTRATE PROCESSING APPARATUS

(71) Applicant: SCREEN Holdings Co., Ltd., Kyoto (JP)

(72) Inventors: Akito Hatano, Kyoto (JP); Toyohide Hayashi, Kyoto (JP); Koji Hashimoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 14/426,783

(22) PCT Filed: Jun. 18, 2013

(86) PCT No.: PCT/JP2013/066665
§ 371 (c)(1),
(2) Date: Mar. 9, 2015

(87) PCT Pub. No.: WO2014/050228
PCT Pub. Date: Apr. 3, 2014

(65) Prior Publication Data
US 2015/0287624 A1    Oct. 8, 2015

(30) Foreign Application Priority Data

Sep. 26, 2012  (JP) .................................. 2012-211627

(51) Int. Cl.
*H01L 21/677* (2006.01)
*H01L 21/67* (2006.01)

(52) U.S. Cl.
CPC ..... *H01L 21/67742* (2013.01); *H01L 21/6776* (2013.01); *H01L 21/67178* (2013.01);
(Continued)

(58) Field of Classification Search
CPC .................. H01L 21/67178; H01L 21/67196; H01L 21/67745; H01L 21/67748; H01L 21/67706
See application file for complete search history.

(56) References Cited

U.S. PATENT DOCUMENTS

| 2006/0245853 | A1* | 11/2006 | Okuno | H01L 21/67742 414/217 |
| 2007/0081881 | A1* | 4/2007 | Okuno | H01L 21/67745 414/217 |
| 2009/0053020 | A1* | 2/2009 | Okuno | H01L 21/67745 414/222.01 |

FOREIGN PATENT DOCUMENTS

| JP | 11-097506 | 4/1999 |
| JP | 11-111797 | 4/1999 |

(Continued)

OTHER PUBLICATIONS

International Search Report mailed Jul. 16, 2013 in corresponding PCT International Application No. PCT/JP2013/066665.
(Continued)

*Primary Examiner* — Gerald McClain
(74) *Attorney, Agent, or Firm* — Ostrolenk Faber LLP (57) ABSTRACT

An object of the present invention is to provide a technique capable of reducing a volume occupied exclusively by a substrate processing apparatus. In order to achieve this object, a substrate processing apparatus includes: multiple processing parts that process a substrate W; a transport robot that makes rectilinear motion along one rectilinear axis or each of more rectilinear axes and rotative motion about a vertical axis to transport a substrate to each of the processing parts; a transport chamber defined as operating space for the transport robot; and a transport controller that controls operation of the transport robot. A first partial area defined in the transport chamber has a width (specifically, a width extending along a horizontal axis perpendicular to the one rectilinear axis or the more rectilinear axes) is smaller than a rotative diameter of the transport robot. The transport controller prohibits the rotative motion of the transport robot in the first partial area.

3 Claims, 5 Drawing Sheets

(52) U.S. Cl.
CPC ... *H01L21/67196* (2013.01); *H01L 21/67706* (2013.01); *H01L 21/67745* (2013.01); *H01L 21/67748* (2013.01)

(56) References Cited

FOREIGN PATENT DOCUMENTS

| JP | 11097506 A | * | 4/1999 |
| JP | 11111797 A | * | 4/1999 |
| JP | 2004-119714 | | 4/2004 |
| JP | 2004119714 A | * | 4/2004 |
| JP | 2006-073835 | | 3/2006 |
| JP | 2006073835 A | * | 3/2006 |
| JP | 2009-260087 | | 11/2009 |
| JP | 2010-192559 | | 9/2010 |
| JP | 2010192559 A | * | 9/2010 |
| JP | 2011-054998 | | 3/2011 |
| TW | 2009-15470 | | 4/2009 |

OTHER PUBLICATIONS

International Preliminary Report on Patentability (IPRP) issued by the IPEA/EP Patent Office on Apr. 9, 2015 in connection with corresponding application PCT/JP2013/066665.

Taiwanese Office Action issued on Mar. 13, 2015 in connection with Taiwanese Application No. 102134349 with English and Japanese translation of relevant parts.

Japanese Office Action issued Jun. 28, 2016 and English translation thereof.

* cited by examiner

SUBSTRATE PROCESSING APPARATUS

CROSS-REFERENCE TO RELATED APPLICATIONS

The present application is a 35 U.S.C. §§371 national phase conversion of PCT/JP2013/066665, filed Jun. 18, 2013, which claims priority to Japanese Patent Application No. JP2012-211627, filed Sep. 26, 2012, the contents of which are incorporated herein by reference. The PCT International Application was published in the Japanese language.

TECHNICAL FIELD

The present invention relates to a substrate processing apparatus that processes a substrate. A substrate to be processed includes a semiconductor wafer, a printed board, a substrate for a liquid crystal display, a substrate for a plasma display, a substrate for an FED (field emission display), a substrate for an optical disk, a substrate for a magnetic disk, a substrate for a magnetooptical disk, a substrate for a photomask, and a substrate for a solar cell, for example.

BACKGROUND ART

A single-wafer substrate processing apparatus may be used in a step of manufacturing a semiconductor device, for example. This substrate processing apparatus includes multiple processing parts that house one substrate and process this substrate, and a transport robot that transports the substrate into and out of these processing parts (see patent literatures 1 and 2, for example).

In an example of this substrate processing apparatus, multiple processing parts are arranged on each of opposite sides of a linear transport path. The transport robot transports substrates to each processing part one after another in a predetermined order while making straight line movement (rectilinear motion) along the transport path and rotative motion around a vertical axis. As a result, the substrates are processed one after another.

PRIOR ART LITERATURES

Patent Literatures

Patent Literature 1: Japanese Patent Application Laid-Open No. 2009-260087
Patent Literature 2: Japanese Patent Application Laid-Open No. 2010-192559

SUMMARY OF INVENTION

Problems to be Solved by Invention

In the aforementioned substrate processing apparatus, in terms of enhancing throughput, the transport robot generally rotates while making straight line movement along the transport path (specifically, makes rectilinear motion and rotative motion simultaneously) to move to a position facing a target processing part.

To make the transport robot make rectilinear motion and rotative motion simultaneously, however, the width of the transport path (specifically, a width extending along a horizontal axis perpendicular to a direction where the transport path extends) should be the same as or greater than the rotative diameter of the transport robot throughout the transport path. This increases the volume of a transport chamber defined as operating space for the transport robot, leading to increase in a volume occupied exclusively by the substrate processing apparatus.

The present invention has been made in view of the aforementioned problem. The present invention is intended to provide a technique capable of reducing a volume occupied exclusively by a substrate processing apparatus.

Means of Solving Problems

A first aspect is intended for a substrate processing apparatus that processes a substrate, including: multiple processing parts that process a substrate; a transport device that makes rectilinear motion along one rectilinear axis or each of more rectilinear axes and rotative motion about a vertical axis to transport a substrate to each of the processing parts; a transport chamber defined as operating space for the transport device; and a transport controller that controls operation of the transport device. A first partial area defined in the transport chamber has a width smaller than a rotative diameter of the transport device. The width extends along a horizontal axis perpendicular to the one rectilinear axis or the more rectilinear axes. The transport controller prohibits the rotative motion of the transport device in the first partial area.

A second aspect is intended for the substrate processing apparatus according to the first aspect. In this substrate processing apparatus, each of the processing parts includes: a housing; and an opening for entry of a hand of the transport device into the housing. The opening is formed in the housing. Multiple second partial areas are defined in the transport chamber. The second partial areas are spaced at an interval along the one rectilinear axis or any of the more rectilinear axes. The second partial areas are connected via the first partial area. The processing parts are arranged such that the openings of the processing parts surround the second partial areas. The transport controller permits the rotative motion of the transport device in the second partial areas.

A third aspect is intended for the substrate processing apparatus according to the first or second aspect. In this substrate processing apparatus, the one rectilinear axis or the more rectilinear axes include an axis extending along and within a horizontal plane.

A fourth aspect is intended for the substrate processing apparatus according to any one of the first to third aspects. In this substrate processing apparatus, the one rectilinear axis or the more rectilinear axes include a vertical axis.

Advantageous Effects of Invention

In the substrate processing apparatus of the first aspect, the width of the transport chamber (specifically, a width extending along a horizontal axis perpendicular to the rectilinear axis of the transport device) is in part smaller than the rotative diameter of the transport device. This reduces a volume occupied by the transport chamber. As a result, a volume occupied exclusively by the substrate processing apparatus is reduced.

In the substrate processing apparatus of the second aspect, the multiple second partial areas where the rotative motion of the transport device is permitted are spaced at an interval along the rectilinear axis of the transport device and the processing parts are arranged such that their respective openings surround these second partial areas. This structure allows arrangement of a large number of the processing parts while keeping a volume occupied by the transport chamber small.

In the substrate processing apparatus of the third aspect, the one rectilinear axis or the more rectilinear axes include an axis extending along and within a horizontal plane. Specifically, the transport device can make rectilinear motion along and within the horizontal plane. Thus, the number of the processing parts can be increased by arranging multiple processing parts along the rectilinear axis extending along and within the horizontal plane.

In the substrate processing apparatus of the fourth aspect, the one rectilinear axis or the more rectilinear axes include a vertical axis. Specifically, the transport device can make rectilinear motion along the vertical axis. Thus, the number of the processing parts can be increased by stacking multiple processing parts along the vertical axis.

These and other objects, features, aspects and advantages of the present invention will become more apparent from the following detailed description of the present invention and the accompanying drawings.

DESCRIPTION OF EMBODIMENT(S)

An embodiment of the present invention is described below by referring to the accompanying drawings. The embodiment described below is an example of materialization of the present invention and is not intended to limit the technical scope of the present invention. To facilitate understanding, the dimension of each part and the number of such parts may be exaggerated or simplified in the drawings.

<1. Structure of Substrate Processing Apparatus>

Figure 1:
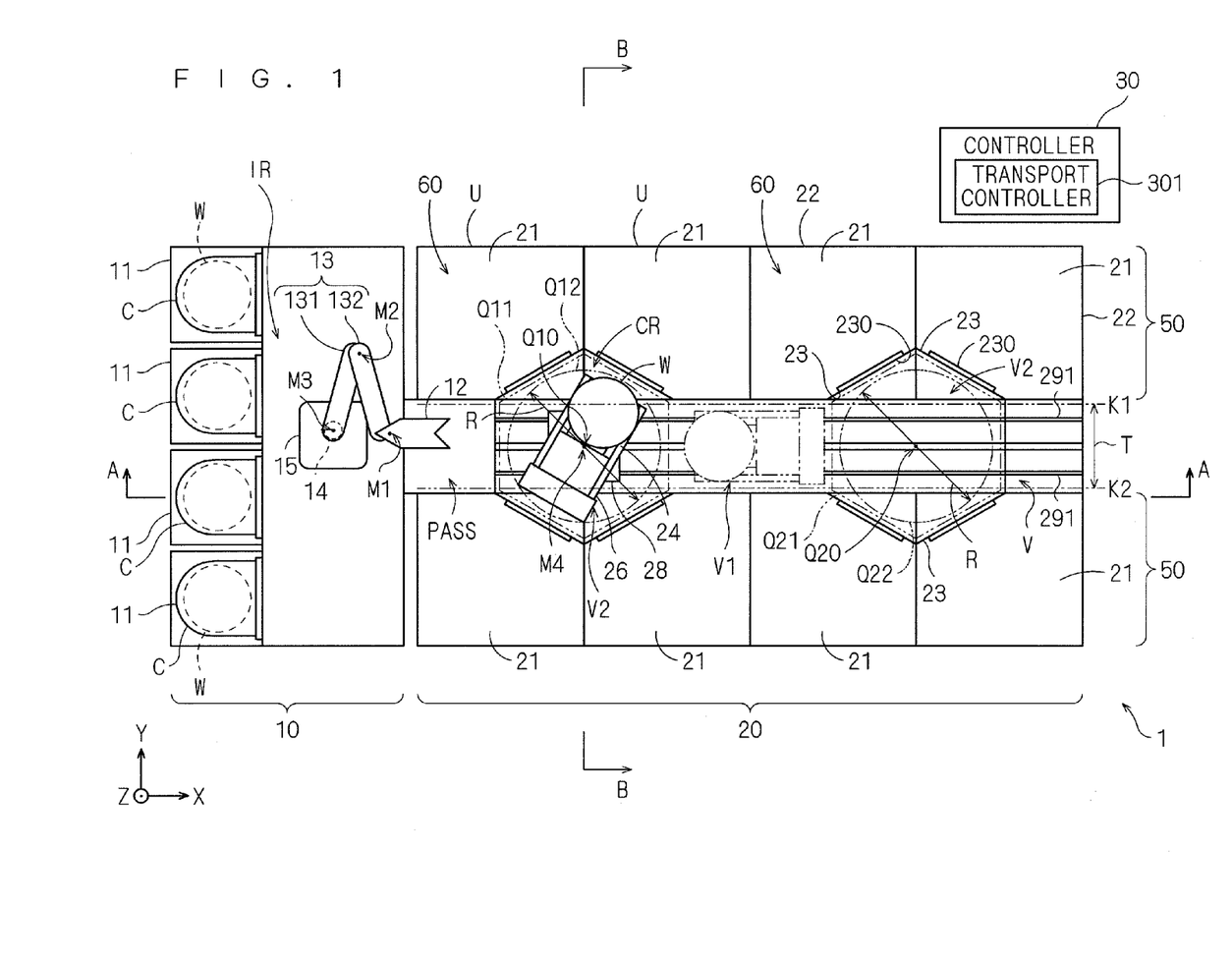
FIG. 1 is a plan view showing an outline of a substrate processing apparatus of an embodiment.
Figure 2:
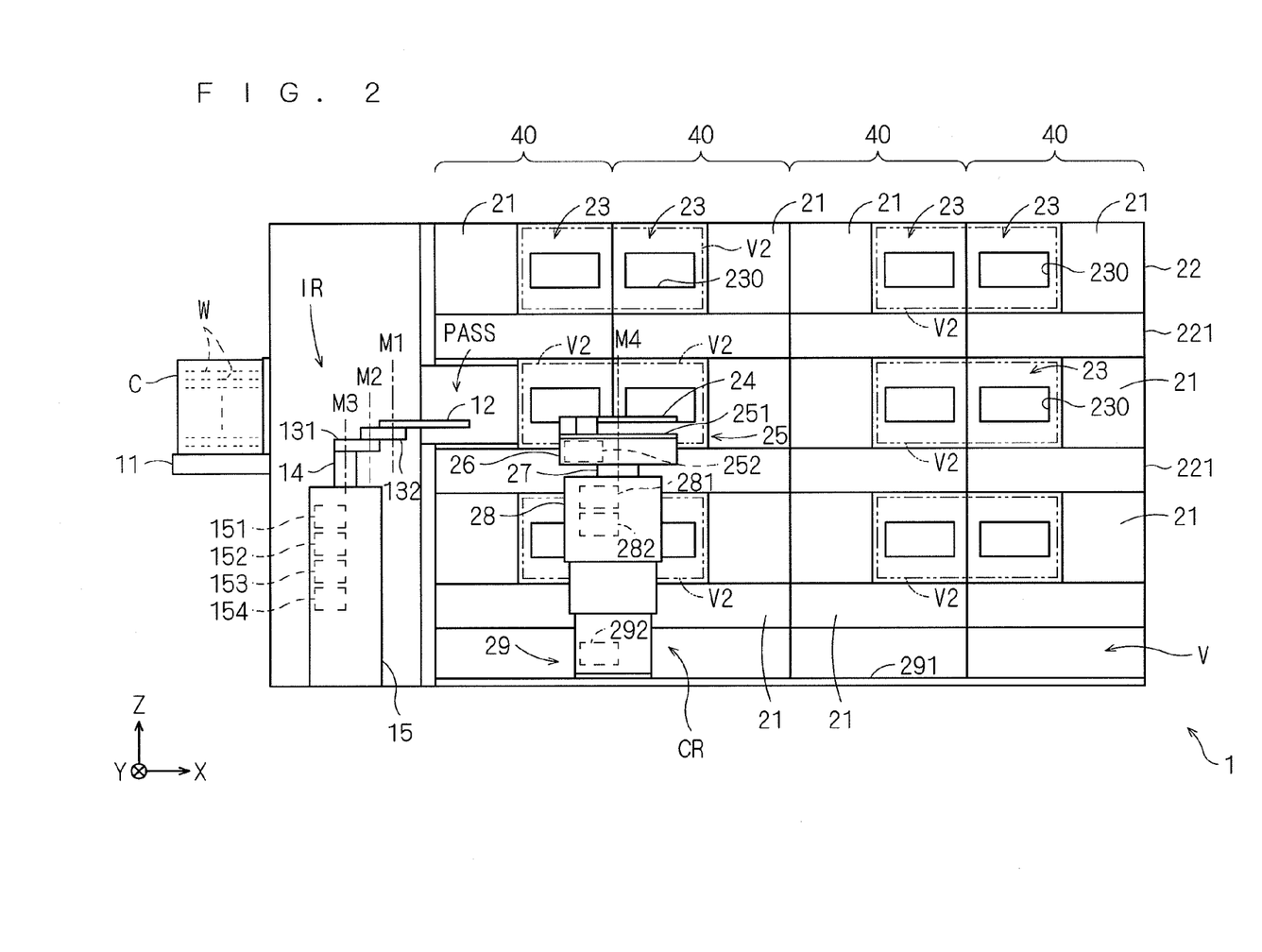
FIG. 2 is a view of the substrate processing apparatus taken along line A-A of FIG. 1.
Figure 3:
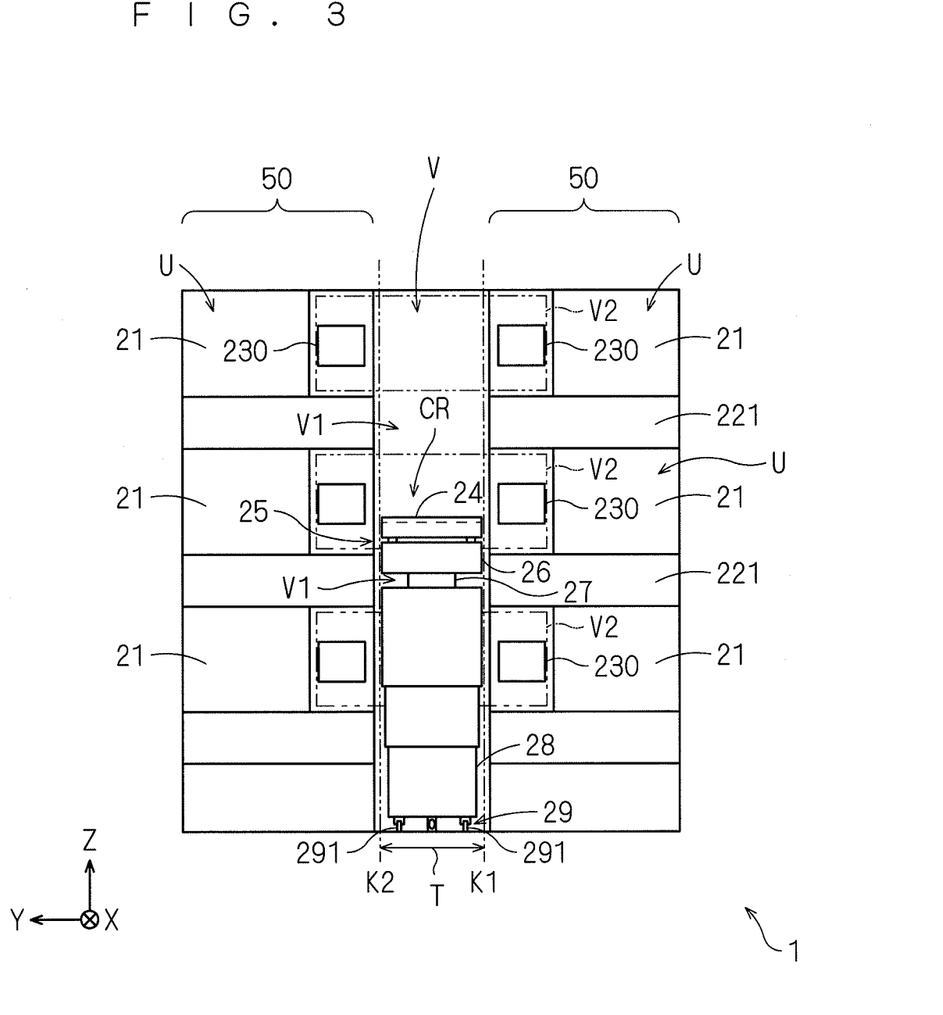
FIG. 3 is a view of the substrate processing apparatus taken along line B-B of FIG. 1.
Figure 4:
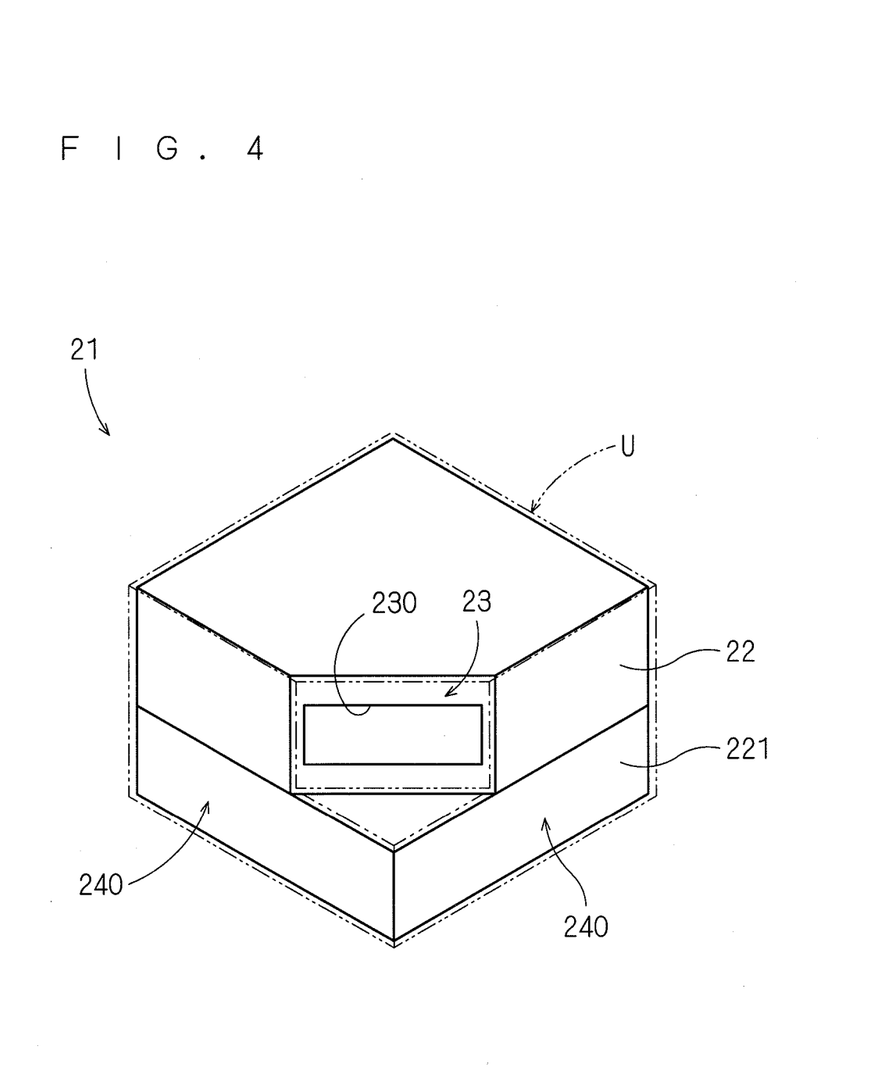
FIG. 4 schematically shows a unit processing chamber.
Figure 5:
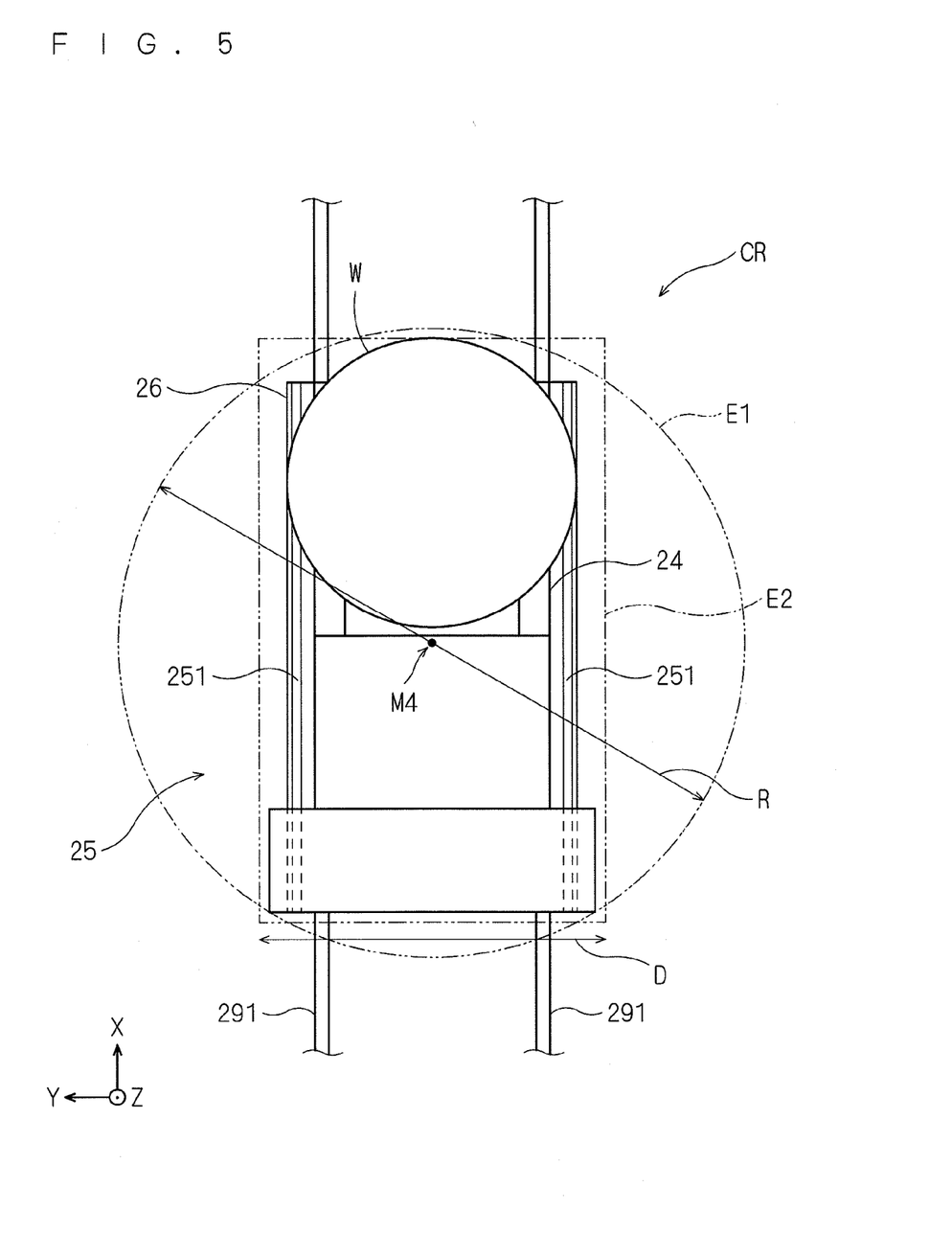
FIG. 5 is a plan view showing an outline of a transport robot.

The structure of a substrate processing apparatus 1 of the embodiment is described by referring to FIGS. 1 to 5. FIG. 1 is a plan view showing an outline of the substrate processing apparatus 1. FIG. 2 is a view of the substrate processing apparatus 1 taken along line A-A of FIG. 1. FIG. 3 is a view of the substrate processing apparatus 1 taken along line B-B of FIG. 1. FIG. 4 schematically shows a unit processing chamber U. FIG. 5 is a plan view of a transport robot CR. Where appropriate, the drawings to be referred to below are given an XYZ rectangular coordinate system defining a Z-axis direction as a vertical direction and an XY plane as a horizontal plane.

The substrate processing apparatus 1 is an apparatus that performs certain process (the process mentioned herein is cleaning process, for example) on a substrate W (more specifically, a semiconductor wafer of a diameter of 450 mm, for example). The substrate processing apparatus 1 processes multiple substrates W continuously.

The substrate processing apparatus 1 is formed of two cells (processing blocks) in juxtaposition including an indexer cell 10 and a processing cell 20. A substrate transferring part PASS is provided between the indexer cell 10 and the processing cell 20. The substrate transferring part PASS holds a substrate W to be transferred between processing cells (more specifically, between a transfer robot IR in the indexer cell 10 and the transport robot CR in the processing cell 20).

The substrate processing apparatus 1 further includes a controller 30 that controls each operating mechanism in each of the indexer cell 10 and the processing cell 20. The hardware structure of the controller 30 is the same as that of a generally used computer. Specifically, the controller 30 includes a CPU to make various calculations, a ROM as a read-only memory to store a basic program, a RAM as a freely readable and writable memory to store information of various types, and a magnetic disk to store control software or data. In the controller 30, the CPU functioning as a main controller makes calculations according to a procedure written in a program, thereby realizing various functional parts that control each part of the substrate processing apparatus 1 (such as a transport controller 301 that controls the operation of the transport robot CR). Some or all of the functional parts realized by the controller 30 can be realized in terms of hardware by a dedicated logic circuit, for example.

<1-1. Indexer Cell 10>

The indexer cell 10 is a cell that transfers an unprocessed substrate W received from the outside of the apparatus to the processing cell 20 and transports a processed substrate W received from the processing cell 20 out of the apparatus. The indexer cell 10 includes multiple (in the example of the drawings, four) carrier stages 11 on which carriers C are placed, and the transfer robot IR that transports a substrate W to and out of each carrier C.

<Carrier Stage 11>

The carrier C housing an unprocessed substrate W is transported from the outside of the apparatus and placed on each carrier stage 11 by an AGV (automated guided vehicle), for example. After the substrate W is processed in the apparatus, the processed substrate W is housed again in the carrier C on the carrier stage 11. The carrier C housing the processed substrate W is transported out of the apparatus by the AGV, for example. Specifically, the carrier stage 11 functions as a substrate collecting part that collects an unprocessed substrate W and a processed substrate W. The carrier C can be an FOUP (front opening unified pod) housing a substrate W in hermetically-sealed space, an SMIF (standard mechanical interface) pod, or an OC (open cassette) that exposes a substrate W housed in the carrier C to external air.

<Transfer Robot IR>

The transfer robot IR takes an unprocessed substrate W out of the carrier C on the carrier stage 11 and places the unprocessed substrate W on the substrate transferring part PASS between the indexer cell 10 and the processing cell 20. The transfer robot IR houses a processed substrate W on the substrate transferring part PASS into the carrier C on the carrier stage 11.

The transfer robot IR has a hand 12 that supports a substrate W from below to hold the substrate W in a horizontal posture (a posture that places a main surface of the substrate W parallel to the horizontal plane (XY plane)). The hand 12 is formed into a fork shape in a plan view, for example, and supports a lower surface of one substrate W at the fork segment.

The hand 12 has a base end held on one end of a multi-joined arm 13 that moves the hand 12 in the horizontal plane in a manner that allows turning motion (turning motion around a vertical axis M1) of the hand 12. The multi-jointed arm 13 has an opposite end held on the upper end of a shaft part 14 extending in the vertical direction. The shaft part 14 has a lower end held on a fixed table 15 fixed in the horizontal plane.

The multi jointed arm 13 is formed of a horizontally extending first arm segment 131 and a horizontally extending second arm segment 132. The first arm segment 131 has one end coupled to the upper end of the shaft part 14 and an opposite end coupled to the second arm segment 132. The second arm segment 132 has one end coupled to the first arm segment 131 and an opposite end coupled to the hand 12. The second arm segment 132 is coupled to the first arm segment 131 in a manner that allows turning motion (turning motion around a vertical axis M2) of the second arm segment 132.

The transfer robot IR includes a first rotary driving part 151 that turns the hand 12 around the rotary axis M1 extending in the vertical direction (Z-axis direction). The transfer robot IR further includes a second rotary driving part 152 that turns the second arm segment 132 around the rotary axis M2 extending in the vertical direction. The transfer robot IR further includes a third rotary driving part 153 that turns the shaft part 14 around a rotary axis M3 extending in the vertical direction, and an up-and-down driving part 154 that moves the shaft part 14 up and down in the vertical direction. Each of the driving parts 151, 152, 153, and 154 includes a motor and the like and is built inside the fixed table 15, for example.

In this structure, in response to drive by the first rotary driving part 151, the hand 12 held on the tip of the multi-jointed arm 13 rotates. Further, the second rotary driving part 152 turns the second arm segment 132 and the third rotary driving part 153 turns the shaft part 14, thereby bending or extending the multi jointed arm 13 to move the hand 12 in the horizontal plane. The third rotary driving part 153 turns the shaft part 14 to rotate the multi jointed arm 13 and the hand 12 held on the tip of the multi jointed arm 13. The up-and-down driving part 154 moves the shaft part 14 up and down to move the multi jointed arm 13 and the hand 12 held on the tip of the multi jointed arm 13 up and down.

In this way, in the transfer robot IR, the multi jointed arm 13, the shaft part 14, and each of the driving parts 151 to 154 form a hand driving mechanism that drives the hand 12. In response to drive by the hand driving mechanism, the hand 12 can move in the horizontal plane and can move up and down. As a result, the transfer robot IR can move the hand 12 to a position facing an intended carrier C (or a positon facing the substrate transferring part PASS). Additionally, the transfer robot IR makes the hand 12 advance and retreat and move the hand 12 up and down, so that a substrate W can be transferred between the hand 12 and a carrier C (or the substrate transferring part PASS) facing the hand 12.

The transfer robot IR may be formed of hands 12 and multi jointed arms 13 in multiple groups arranged on the fixed table 15. Alternatively, multiple hands 12 may be provided to a common multi jointed arm 13.

<1-2. Processing Cell 20>

The processing cell 20 is a cell that performs certain process (here, cleaning process) on a substrate W. The processing cell 20 includes multiple processing parts 21 that performs the process on the substrate. The processing cell 20 further includes the transport robot CR that transports a substrate W between the multiple processing parts 21 and the substrate transferring part PASS.

<Processing Part 21>

The processing part 21 performs scrubbing cleaning process on a substrate W. More specifically, the processing part 21 includes a spin chuck that rotates a substrate W around a shaft center extending in the vertical direction while holding the substrate W in a horizontal posture that makes the front surface (or the rear surface) of the substrate W point upward, a cleaning brush that abuts on the substrate W or comes close to the substrate W held on the spin chuck to be used for scrubbing cleaning of the substrate W, a nozzle from which a cleaning liquid (pure water, for example) is discharged to the substrate W, a spin motor that rotates the spin chuck, a cup that surrounds the circumference of the substrate W held on the spin chuck, a pipe, an electric component, and a chemical liquid cabinet, for example (all of them are not shown in the drawings). The processing part 21 further includes a housing 22 that houses the spin chuck, the cleaning brush, the nozzle, the cup and others. The processing part 21 is not limited to a processing part that performs the scrubbing cleaning process. The processing part 21 may alternatively be a processing part that cleans a substrate W by supplying a processing liquid without using a cleaning brush.

A group of the elements of the processing part 21 is arranged in a unit processing chamber U defined as storage space for these elements. As shown in FIG. 4, the unit processing chamber U has a shape with an oblique surface 23 formed by cutting one corner out of an upper part of an object having a cuboidal outer shape.

The group of the elements of the processing part 21 can be laid out freely in the unit processing chamber U. As an example, as shown in the drawing, the housing 22 housing the spin chuck, the cleaning brush, the nozzle, the cup and others may be arranged in internal space of the upper part of the unit processing chamber U having a pentagonal columnar outer shape, and a box 221 housing the pipe, the electric component, the chemical liquid cabinet and others may be arranged in internal space of the lower part of the unit processing chamber U having a cuboidal outer shape. Further, the pipe, the electric component, the chemical liquid cabinet and others may be arranged in the internal space of the cuboidal outer shape in state of being exposed.

The housing 22 housing the spin chuck and others is arranged such that one side wall surface of the housing 22 extends along the oblique surface 23. This side wall surface is given an opening (gateway) 230 for entry of a hand 24 of the transport robot CR described later into the housing 22. Elements including the spin chuck are arranged inside the housing 22 at the back of the gateway 230. The hand 24 having entered the housing 22 through the gateway 230 can receive a substrate W on the spin chuck (or a substrate W held by the hand 24 having entered the housing 22 can be transferred onto the spin chuck). It is preferable that the gateway 230 can be opened and closed by a shutter, for example.

Layout of the multiple processing parts 21 is described next. In this embodiment, multiple processing parts 21 (in this embodiment, three processing parts 21, for example) are stacked in the vertical direction to form one processing part unit 40. Multiple processing part units 40 (in this embodiment, four processing part units 40, for example) are arranged in line in the X direction to form one unit group 50. In the processing cell 20, two unit groups 50 are arranged to face each other while a gap is formed between these unit groups 50. Space between the two unit groups 50 forms a transport chamber V defined as operating space for the transport robot CR.

Each of the processing parts 21 in a group belonging to the unit group 50 on the +Y side relative to the transport chamber V is arranged such that one vertical surface 240 of an L-shape in a plan view in the unit processing chamber U (see FIG. 4) extends along a virtual vertical surface (first vertical surface) K1 extending parallel to the X axis. Each of the processing parts 21 in a group belonging to the unit group 50 on the −Y side relative to the transport chamber V is arranged such that one vertical surface 240 of an L-shape in a plan view in the unit processing chamber U extends along a virtual vertical surface (second vertical surface) K2 extending parallel to the X axis.

A distance T between the first and second vertical surfaces K1 and K2 is determined to be smaller than a rotative diameter R of the transport robot CR and to be greater than a minimum width D of the transport robot CR. In a plan view of the transport robot CR holding a substrate W taken along the Z axis (FIG. 5), where a virtual circle E1 in which the transport robot CR is inscribed is assumed having its center agreeing with a rotary axis M4 of the transport robot CR, the "rotative diameter R of the transport robot CR" corresponds to a diameter R of the circle E1. In the plan view of the transport robot CR holding a substrate W taken along the Z axis (FIG. 5), where a virtual rectangle E2 in which the transport robot CR is inscribed is assumed, the "minimum width D of the transport robot CR" corresponds to a length D of a short side of the rectangle E2. In the example of the drawing, the width dimension of a root of the hand 24 of the transport robot CR is shown to agree with the minimum width D. This width dimension however does not always define the minimum width D. As an example, the diameter of a substrate W may be greater than this width dimension. In this case, the diameter of the substrate W becomes the minimum width D.

Four processing part units 40 arranged in the half of the processing cell 20 on the −x side (specifically, two processing part units 40 on the −x side out of four processing part units 40 forming a unit group 50 on the +Y side relative to the transport chamber V and two processing part units 40 on the −x side out of four processing part units 40 forming a unit group 50 on the −Y side relative to the transport chamber V), and the substrate transferring part PASS are placed in a cluster pattern (tufted pattern) so as to surround a first center axis Q10. More specifically, in a plan view taken along the Z axis, each processing part 21 in each of these four processing part units 40 is arranged such that the oblique surface 23 extends along any of sides of a virtual polygon (here, a hexagon) Q11 that assumes the first center axis Q10 as its center. The substrate transferring part PASS is arranged to face a terminal side of the polygon Q11 on the −x side. The polygon Q11 is larger than a virtual circle Q12. The "virtual circle Q12" is a virtual circle having a diameter agreeing with the rotative diameter R of the transport robot CR and having a center agreeing with the first center axis Q10.

Likewise, four processing part units 40 arranged in the half of the processing cell 20 on the +x side (specifically, two processing part units 40 on the +x side out of the four processing part units 40 forming the unit group 50 on the +Y side relative to the transport chamber V and two processing part units 40 on the +x side out of the four processing part units 40 forming the unit group 50 on the −Y side relative to the transport chamber V) are placed in a cluster pattern (tufted pattern) so as to surround a second center axis Q20. More specifically, in a plan view taken along the Z axis, each processing part 21 in each of these four processing part units 40 is arranged such that the oblique surface 23 extends along any of sides of a virtual polygon (here, a hexagon) Q21 that assumes the second center axis Q20 as its center. The polygon Q21 is larger than a virtual circle Q22. The "virtual circle Q22" is a virtual circle having a diameter agreeing with the rotative diameter R of the transport robot CR and having a center agreeing with the second center axis Q20.

Four processing parts 21 placed in the same height position in a cluster pattern so as to surround the common center axis Q10 or Q20 are called an "opposite processing part group 60." The processing cell 20 of this embodiment includes three stacked opposite processing part groups 60 each surrounding the first center axis Q10 and three stacked opposite processing part groups 60 each surrounding the second center axis Q20. Specifically, the processing cell 20 includes six opposite processing part groups 60 arranged in a matrix.

As described above, space between the two unit groups 50 forms the transport chamber V defined as operating space for the transport robot CR. A columnar partial area inside the transport chamber V surrounded by the respective gateways 230 of four processing parts 21 forming one opposite processing part group 60 is called a "second partial area V2." Specifically, in the processing cell 20, processing parts 21 in a group forming the opposite processing part group 60 are arranged such that the respective gateways 230 of these processing parts 21 surround the common second partial area V2 in the horizontal plane. The second partial area V2 may be an area in a height range which covers at least a height position where a substrate W is transferred between the transport robot CR and the processing part 21 (more specifically, the height range of the gateway 230, for example) and which does not exceed the height range of the oblique surface 23.

An area in the transport chamber V except the second partial area V2 is called a "first partial area V1." As described above, the processing parts 21 in a group on the +Y side relative to the transport chamber V are arranged along the first vertical surface K1 and the processing parts 21 in a group on the −Y side relative to the transport chamber V are arranged along the second vertical surface K2. The distance T between the first and second vertical surfaces K1 and K2 is greater than the minimum width D of the transport robot CR and smaller than the rotative diameter R of the transport robot CR. Thus, the width of the first partial area V1 along the Y axis is greater than the minimum width D of the transport robot CR and smaller than the rotative diameter R of the transport robot CR.

As described above, the processing cell 20 includes the six opposite processing part groups 60 arranged in a matrix. An area surrounded by the respective gateways 230 of processing parts 21 in a group forming one opposite processing part group 60 becomes the second partial area V2. Thus, six second partial areas V2 in a matrix are defined in the transport chamber V. As shown in FIG. 1, multiple second partial areas V2 spaced at an interval along the X axis (specifically, second partial areas V2 in a group in the same Z position) are connected via the first partial area V1. As shown in FIG. 3, multiple second partial areas V2 spaced at intervals along the Z axis (specifically, second partial areas V2 in a group in the same X position) are also connected via the first partial areas V1.

<Transport Robot CR>

The transport robot CR is arranged in the aforementioned transport chamber V and transports a substrate W between the substrate transferring part PASS and each processing part 21. More specifically, the transport robot CR receives an unprocessed substrate W on the substrate transferring part PASS and transports the received substrate W to a given processing part 21. Then, the transport robot CR receives the processed substrate W from the processing part 21 and transports the received substrate W to the substrate transferring part PASS. The inside and the outside of the transport chamber V where the transport robot CR is arranged are isolated for example by a wall surface of the housing 22 of the processing part 21 or a wall surface of the box 221 housing the electric component and the like.

<i. Structure>

The structure of the transport robot CR is described. The transport robot CR includes the hand 24 that supports a substrate W from below to hold the substrate W in a horizontal posture (a posture that places the main surface of the substrate W parallel to the horizontal plane (XY plane)). The hand 24 is formed into a fork shape in a plan view, for example, and supports a lower surface of one substrate W at the fork segment.

Each hand 24 is supported above a rotary table 26 via an advance-and-retreat driving part 25. The rotary table 26 is supported above a movable table 28 via an up-and-down shaft part 27. A movable table driving part 29 that moves the movable table 28 along the X axis is arranged below the movable table 28.

The advance-and-retreat driving part 25 is a mechanism that makes sliding movement of the hand 24 relative to the rotary table 26. More specifically, the advance-and-retreat driving part 25 for example includes a guide rail 251 extending over the rotary table 26 and along which a base end of the hand 24 can make sliding movement, and a driving segment 252 that makes sliding movement of the base end of the hand 24 along the guide rail 251. The length of the guide rail 251 in a direction where the guide rail 251 extends is determined according to the dimension of a stroke required for the hand 24. The greater length of the guide rail 251 flattens the virtual rectangle E2 more in which the transport robot CR is inscribed, in other words, increases the rotative diameter R defining an area required for rotation of the transport robot CR. This increases a difference between the rotative diameter R and the minimum width D.

The transport robot CR includes a rotary driving part 281 that turns the up-and-down shaft part 27 around the rotary axis M4 extending in the vertical direction (Z-axis direction), and an up-and-down driving part 282 that moves the up-and-down shaft part 27 up and down in the vertical direction. Each of the driving parts 281 and 282 includes a motor and the like and is built inside the movable table 28, for example.

The movable table driving part 29 is a mechanism that makes sliding movement of the movable table 28 along the X axis. More specifically, the movable table driving part 29 for example includes a guide rail 291 extending over a base of the substrate processing apparatus 1 and along which the movable table 28 can make sliding movement, and a driving segment 292 that makes sliding movement of the movable table 28 along the guide rail 291. The driving segment 292 can include a linear motor and the like.

In this structure, in response to drive by the movable table driving part 29, the movable table 28 makes straight line movement in the X-axis direction. The up-and-down driving part 282 moves the up-and-down shaft part 27 up and down. In response, the hand 24 and the rotary table 26 make straight line movement along the Z axis (up-and-down movement). In the below, movement along an axis of a straight line (rectilinear axis) is also called "rectilinear motion." Specifically, the transport robot CR is configured such that it can make rectilinear motion along the X axis as a rectilinear axis extending along and within the horizontal plane, and rectilinear motion along the vertical axis (Z axis) as a rectilinear axis. The rotary driving part 281 turns the up-and-down shaft part 27, thereby rotating the hand 24 and the rotary table 26 around the rotary axis M4 extending in the vertical direction (Z-axis direction). Specifically, the transport robot CR is configured such that it can make rotative motion about the vertical axis M4. In response to drive by the advance-and-retreat driving part 25, the hand 24 advances and retreats relative to the rotary table 26. Specifically, the transport robot CR is configured such that the hand 24 can advance and retreat in a direction of the radius of rotation.

In response to rectilinear motion of the transport robot CR, the hand 24 can move to a position corresponding to an arbitrary one of multiple opposite processing part groups 60 in a matrix. Then, the transport robot CR makes rotative motion. Thus, the transport robot CR can move the hand 24 to a position facing the gateway 230 of an arbitrary one of multiple processing parts 21 forming the arbitrary opposite processing part group 60 (or a position facing the substrate transferring part PASS). Then, the transport robot CR advances and retreats in the direction of the rotation and moves up and down. Thus, a substrate W can be transferred between the arbitrary processing part 21 (or the substrate transferring part PASS) and the transport robot CR.

The transport robot CR may be formed of hands 24, advance-and-retreat driving parts 25, and rotary tables 26 in multiple groups arranged on the movable table 28. Alternatively, the transport robot CR may be formed of hands 24 and advance-and-retreat driving parts 25 in multiple groups arranged on a common rotary table 26. Still alternatively, multiple hands 24 may be provided on a common advance-and-retreat driving part 25.

<ii. Transport Controller 301>

In the controller 30, the CPU as a main controller makes calculations according to a procedure written in a program, thereby realizing the transport controller 301 that controls the operation of the transport robot CR. The transport robot CR makes given transport operation in response to control by the transport controller 301.

The transport controller 301 prohibits rotative motion of the transport robot CR in the first partial area V1 in the transport chamber V and permits rotative motion of the transport robot CR in the second partial area V2 in the transport chamber V. Specifically, the transport controller 301 permits rotative motion of the transport robot CR only in the second partial area V2 in the transport chamber V. In other words, the first partial area V1 is a rotation prohibited area where rotative motion of the transport robot CR is prohibited and the second partial area V2 is a rotation permitted area where rotative motion of the transport robot CR is permitted. More specifically, the transport controller 301 permits rotation of the hand 24 only when the hand 24 of the transport robot CR is within the second partial area V2 and prohibits rotative motion of the hand 24 by an interlock when the hand 24 is within the first partial area V1. The transport controller 301 permits rectilinear motion of the transport robot CR throughout the transport chamber V.

To make the transport robot CR enter the first partial area V1 from the second partial area V2, the transport controller 301 rotates the hand 24 in the second partial area V2 to place the hand 24 in a posture extending in the X-axis direction. Then, the transport controller 301 makes the transport robot CR enter the first partial area V1. Thus, while moving within the first partial area V1, the transport robot CR is always in a posture that makes the hand 24 extend in the X-axis direction (specifically, a posture that makes the width agree with the minimum width D) (see the transport robot CR in FIG. 1 indicated by alternate long and short dashed lines).

As described above, each opposite processing part group 60 in the processing cell 20 is arranged such that the respective oblique surfaces 23 of all the processing parts 21 surround the polygon Q11 or Q21. The polygons Q11 and Q21 are larger than the virtual circles Q12 and Q22 respectively each having a diameter agreeing with the rotative diameter R of the transport robot CR. Thus, rotative motion of the transport robot CR will not be interfered in the second partial area V2.

As described above, the width of the first partial area V1 along the Y axis (specifically, a horizontal axis perpendicular to the rectilinear axes (X axis and Z axis) of the transport robot CR) is greater than the minimum width D of the transport robot CR. Thus, while the transport robot CR is in a posture that makes the hand 24 extend in the X-axis direction, rectilinear motion of the transport robot CR will not be interfered in the first partial area V1.

The width of the first partial area V1 along the Y axis (specifically, the horizontal axis perpendicular to the rectilinear axes (X axis and Z axis) of the transport robot CR) is smaller than the rotative diameter R of the transport robot CR. If rotative motion of the transport robot CR is permitted in every area in the transport chamber V, for example, the width along the Y axis should be greater than the rotative diameter R in every area in the transport chamber V. Meanwhile, rotative motion of the transport robot CR is permitted only in a partial area (second partial area V2) in the transport chamber V. This can make the width of a remaining area (first partial area V1) in the transport chamber V along the Y axis smaller than the rotative diameter R. As a result, a volume occupied by the transport chamber V can become small, so that a volume occupied exclusively by the substrate processing apparatus 1 can become small as well. In particular, if there is a relatively large difference between the rotative diameter R and the minimum width D of the transport robot CR, a volume occupied by the substrate processing apparatus 1 can be reduced largely.

<2. Operation of Substrate Processing Apparatus 1>

The operation of the substrate processing apparatus 1 is described by referring to FIGS. 1 to 3. In the substrate processing apparatus 1, the controller 30 controls each part of the substrate processing apparatus 1 according to a recipe that shows a procedure for transporting a substrate W, a processing condition and the like, thereby processing the substrate W.

The carrier C housing an unprocessed substrate W is transported from the outside of the apparatus into the carrier stage 11 in the indexer cell 10 for example by an AGV. Then, the transfer robot IR takes the unprocessed substrate W out of this carrier C and places the substrate W having been taken out onto the substrate transferring part PASS.

After the unprocessed substrate W is placed on the substrate transferring part PASS, the transport robot CR receives the unprocessed substrate W and transports the unprocessed substrate W into a processing part 21 designated in the recipe. This operation by the transport robot CR performed under control of the transport controller 301 is described in detail below.

First, the transport robot CR makes rotative motion in a second partial area V2 facing the substrate transferring part PASS to make the tip of the hand 24 face the substrate transferring part PASS. Then, the transport robot CR moves the hand 24 forward to insert the hand 24 along a lower surface of the unprocessed substrate W on the substrate transferring part PASS. Next, the transport robot CR moves up the hand 24 to hold the unprocessed substrate W on the hand 24. Then, the transport robot CR moves the hand 24 backward. In this way, the unprocessed substrate W is transferred from the substrate transferring part PASS onto the hand 24 of the transport robot CR.

Next, the transport robot CR rotates the hand 24 in the aforementioned second partial area V2 to place the hand 24 in a posture extending along the X axis. Then, the transport robot CR enters the first partial area V1 from this second partial area V2 and moves along the rectilinear axis in the first partial area V1 to reach a second partial area V2 facing the gateway 230 of a target processing part 21.

As described above, the transport chamber V includes six second partial areas V2 in a matrix. If an opposite processing part group 60 including the target processing part 21 is the top opposite processing part group 60 out of the three opposite processing part groups 60 stacked on the +x side, for example, the top second partial area V2 on the +x side becomes a target second partial area V2. The following describes examples of particulars of the aforementioned operation performed in this case. First, the transport robot CR rotates the hand 24 in the second partial area V2 facing the substrate transferring part PASS to place the hand 24 in a posture extending along the X axis. Next, while maintaining the posture of the hand 24 along the X axis, the transport robot CR moves (up) in the +z direction in a first partial area V1 extending along the Z axis. In this way, the transport robot CR moves from the second partial area V2 facing the substrate transferring part PASS to the top second partial area V2 above the second partial area V2 facing the substrate transferring part PASS. After reaching the top second partial area V2, the transport robot CR moves (horizontally) in the +x direction in a first partial area V1 extending along the X axis while maintaining the posture of the hand 24 along the X axis. In this way, the transport robot CR moves from the top second partial area V2 on the −x side to the top second partial area V2 on the +x side (specifically, to the target second partial area V2).

If the opposite processing part group 60 including the target processing part 21 is the bottom opposite processing part group 60 out of the three opposite processing part groups 60 stacked on the −x side, for example, the bottom second partial area V2 on the −x side becomes the target second partial area V2. The following describes examples of particulars of the aforementioned operation performed in this case. First, the transport robot CR rotates the hand 24 in the second partial area V2 facing the substrate transferring part PASS to place the hand 24 in a posture extending along the X axis. Next, while maintaining the posture of the hand 24 along the X axis, the transport robot CR moves (down) in the −z direction in a first partial area V1 extending along the Z axis. In this way, the transport robot CR moves from the second partial area V2 facing the substrate transferring part PASS to the bottom second partial area V2 below the second partial area V2 facing the substrate transferring part PASS (specifically, to the target second partial area V2).

After reaching the target second partial area V2, the transport robot CR makes rotative motion in the target second partial area V2 to make the tip of the hand 24 face the gateway 230 of the target processing part 21. Then, the transport robot CR moves the hand 24 forward to make the hand 24 go into the housing 22 through the gateway 230. Next, the transport robot CR moves down the hand 24 to transfer the unprocessed substrate W from the hand 24 onto a spin chuck in the housing 22. Then, the transport robot CR moves the hand 24 backward to pull the empty hand 24 out of the housing 22. In this way, the substrate W is transported into the target processing part 21.

The processing part 21 having received the substrate W performs cleaning process on the substrate W. As a specific example, in the processing part 21, while the substrate W is held on the spin chuck and rotated by the spin chuck, a cleaning liquid is supplied from a nozzle to the substrate W. In this condition, a cleaning brush abuts on the substrate W or comes close to the substrate W to scan the substrate W in the horizontal direction, thereby performing scrubbing cleaning process on the substrate W.

After the processing part 21 finishes the cleaning process on the substrate W, the transport robot CR takes the processed substrate W and transports the processed substrate W to the substrate transferring part PASS. The following describes particulars of this operation performed by the transport robot CR under control of the transport controller 301.

First, the transport robot CR makes rotative motion in the second partial area V2 facing the gateway 230 of the processing part 21 from which the substrate W is to be transported to make the tip of the hand 24 face the gateway 230 of this processing part 21. Then, the transport robot CR moves the hand 24 forward to make the hand 24 go into the housing 22 through the gateway 230 and inserts the hand 24 along the lower surface of the processed substrate W on the spin chuck in the housing 22. Next, the transport robot CR moves up the hand 24 to hold the processed substrate W on the hand 24. Then, the transport robot CR moves the hand 24 backward. In this way, the processed substrate W on the spin chuck is transferred onto the hand 24 of the transport robot CR.

Next, the transport robot CR rotates the hand 24 in the aforementioned second partial area V2 to place the hand 24 in a posture extending along the X axis. Then, the transport robot CR enters the first partial area V1 from this second partial area V2 and moves along the rectilinear axis in the first partial area V1 to reach the second partial area V2 facing the substrate transferring part PASS.

If the processing part 21 from which the processed substrate W has been taken is a processing part 21 belonging to the top opposite processing part group 60 out of the three opposite processing part groups 60 stacked on the +x side, for example, the aforementioned operation is performed in an exemplary way described in detail as follows. First, the transport robot CR rotates the hand 24 in the second partial area V2 facing the processing part 21 from which the processed substrate W has been taken to place the hand 24 in a posture extending along the X axis. Next, while maintaining the posture of the hand 24 along the X axis, the transport robot CR moves (down) in the −z direction in a first partial area V1 extending along the Z axis. In this way, the transport robot CR moves from the top second partial area V2 to the middle second partial area V2 below the top second partial area V2. After reaching the middle second partial area V2, the transport robot CR moves (horizontally) in the −x direction in a first partial area V1 extending along the X axis while maintaining the posture of the hand 24 along the X axis. In this way, the transport robot CR moves from the middle second partial area V2 on the +x side to the middle second partial area V2 on the −x side (specifically, to the second partial area V2 facing the substrate transferring part PASS).

If the processing part 21 from which the processed substrate W has been taken is a processing part 21 belonging to the bottom opposite processing part group 60 out of the three opposite processing part groups 60 stacked on the −x side, for example, the aforementioned operation is performed in an exemplary way described in detail as follows.

First, the transport robot CR rotates the hand 24 in the second partial area V2 facing the processing part 21 from which the processed substrate W has been taken to place the hand 24 in a posture extending along the X axis. Next, while maintaining the posture of the hand 24 along the X axis, the transport robot CR moves (up) in the +z direction in the first partial area V1 extending along the Z axis. In this way, the transport robot CR moves from the bottom second partial area V2 on the −X side to the middle second partial area V2 above this bottom second partial area V2 (specifically, to the second partial area V2 facing the substrate transferring part PASS).

After reaching the second partial area V2 facing the substrate transferring part PASS, the transport robot CR makes rotative motion in this second partial area V2 to make the tip of the hand 24 face the substrate transferring part PASS. Then, the transport robot CR moves the hand 24 forward to place the hand 24 above the substrate transferring part PASS. Next, the transport robot CR moves down the hand 24 to transfer the processed substrate W from the hand 24 onto the substrate transferring part PASS. Then, the transport robot CR moves the hand 24 backward to pull out the empty hand 24. In this way, the substrate W is placed on the substrate transferring part PASS.

After the processed substrate W is placed on the substrate transferring part PASS, the transport robot CR takes out the processed substrate W and houses the processed substrate W into any one of the carriers C.

In the substrate processing apparatus 1, the transport robot CR and the transfer robot IR perform the aforementioned transport operation repeatedly and each processing part 21 performs the cleaning process on a substrate W transported into this processing part 21. As a result, substrates W are subjected to the cleaning process one after another.

<3. Effects>

In the substrate processing apparatus 1 of the aforementioned embodiment, the width of the transport chamber V along the Y axis (specifically, the width extending along a horizontal axis perpendicular to the rectilinear axis of the transport robot CR) is in part smaller than the rotative diameter R of the transport robot CR. This reduces a volume occupied by the transport chamber V. As a result, a volume occupied exclusively by the substrate processing apparatus 1 is reduced.

In the substrate processing apparatus 1 of the aforementioned embodiment, the second partial areas V2 where rotative motion of the transport robot CR is permitted are spaced at an interval along the rectilinear axis of the transport robot CR and the processing parts 21 are arranged such that their respective gateways 230 surround these second partial areas V2. This structure allows arrangement of a large number of the processing parts 21 while keeping a volume occupied by the transport chamber V small.

In the substrate processing apparatus 1 of the aforementioned embodiment, the transport robot CR can make rectilinear motion along the X axis. Thus, the number of the processing parts 21 can be increased by arranging multiple processing parts 21 along the X axis.

In the substrate processing apparatus 1 of the aforementioned embodiment, the transport robot CR can make rectilinear motion along the Z axis (vertical axis). Thus, the number of the processing parts 21 can be increased by stacking multiple processing parts 21 along the vertical axis.

<4. Modifications>

In the substrate processing apparatus 1 of the aforementioned embodiment, the number of and the layout of the processing parts 21 are not limited to those described above.

As an example, in the aforementioned embodiment, each unit group 50 is formed of four processing part units 40 in the processing cell 20. Alternatively, each unit group may be formed of three or less processing part units 40, or five or more processing part units 40. If each unit group is formed of two processing part units 40, for example, a transport robot is required only to make rectilinear motion along the Z axis and rotative motion to move to a position corresponding to an arbitrary processing part 21. Thus, the transport robot can be fixed in the horizontal plane. As another example, in the aforementioned embodiment, each processing part unit 40 is formed of three stacked processing parts 21. Alternatively, each processing part unit may be formed of two or less processing parts 21 or four or more processing parts 21. If each processing part unit is formed of one processing part 21 (specifically, if a processing part is not stacked in a processing cell), for example, a transport robot is required only to make rectilinear motion along the X axis and rotative motion to move to a position facing an arbitrary processing part 21.

In the aforementioned embodiment, there is one substrate transferring part PASS and this substrate transferring part PASS faces the middle second partial area V2 out of the three second partial areas V2 on the −x side. Alternatively, multiple substrate transferring parts PASS may be provided to face corresponding ones of the three second partial areas V2 on the −x side.

The processing part 21 in the processing cell 20 is not limited to that to perform cleaning process on a substrate. Alternatively, the processing part 21 may perform any one of processes including exposure, drying and plasma etching, for example. The processing cell 20 may include two or more types of processing parts 21 that perform respective processes.

A substrate W is not limited to a semiconductor wafer but it may alternatively be a different substrate (such as a printed board, a substrate for a color filter, a glass substrate for a flat panel display provided in a liquid crystal display or a plasma display, a substrate for an optical disk, or a panel for a solar cell). In this case, the substrate processing apparatus 1 may be modified according to the type of a substrate. The substrate processing apparatus 1 is not limited to that to perform cleaning process. The substrate processing apparatus 1 may be modified as an apparatus to perform process such as exposure process, developing process, plasma etching process, or drying process.

Where appropriate, the structures described in each embodiment and each modification can be combined, as long as these structures do not contradict each other.

While the invention has been described in detail, the foregoing description is in all aspects illustrative and not restrictive and is not to limit the invention. It is therefore understood that numerous modifications not shown can be devised without departing from the scope of the invention.

REFERENCE SIGNS LIST

1 Substrate Processing Apparatus
10 Indexer cell
20 Processing cell
21 Processing part
30 Controller
301 Transport controller
CR Transport Robot
V Transport chamber
V1 First partial area
V2 Second partial area
U Unit processing chamber
W Substrate

The invention claimed is:

1. A substrate processing apparatus that processes a substrate, comprising:
   multiple processing parts that process a substrate;
   a transport device with a movable table and a hand that makes rectilinear motion along one rectilinear axis or each of more rectilinear axes and rotative motion about a vertical axis to transport a substrate to each of said processing parts;
   a transport chamber defined as operating space for said transport device; and
   a transport controller that controls operation of said transport device, wherein
   a first partial area defined in said transport chamber has a width smaller than a rotative diameter of said transport device, said width extending along a horizontal axis perpendicular to said one rectilinear axis or said more rectilinear axes, and
   said transport controller prohibits said rotative motion of said transport device in said first partial area;
   wherein each of said processing parts includes:
   a housing; and
   an opening for entry of the hand of said transport device into said housing, said opening being formed in said housing,
   multiple second partial areas are defined in said transport chamber, said second partial areas being spaced at an interval along said one rectilinear axis or any of said more rectilinear axes, said second partial areas being connected via said first partial area,
   said processing parts are arranged such that said openings of said processing parts surround said second partial areas, and
   said transport controller permits said rotative motion of said transport device in said second partial areas,
   wherein said movable table travels between said second partial areas.

2. The substrate processing apparatus according to claim 1, wherein said one rectilinear axis or said more rectilinear axes include a vertical axis.

3. The substrate processing apparatus according to claim 1, wherein said one rectilinear axis or said more rectilinear axes include an axis extending along and within a horizontal plane.

* * * * *